United States Patent [19]

Itoh

[11] Patent Number: 4,807,114
[45] Date of Patent: Feb. 21, 1989

[54] MICROCOMPUTER WITH INTERNALLY AND EXTERNALLY PROGRAMMED EPROM

[75] Inventor: Sakae Itoh, Hyogo, Japan

[73] Assignee: Mitsubishi Denki Kabushiki Kaisha, Tokyo, Japan

[21] Appl. No.: 923,239

[22] Filed: Oct. 27, 1986

[30] Foreign Application Priority Data

Oct. 25, 1985 [JP]  Japan ............................ 60-240094

[51] Int. Cl.[4] ............................................. G06F 1/00
[52] U.S. Cl. .................................................. 364/200
[58] Field of Search ... 364/200 MS File, 900 MS File

[56] References Cited

U.S. PATENT DOCUMENTS

| 4,382,279 | 5/1983 | Ugon | 364/200 |
|---|---|---|---|
| 4,450,521 | 5/1984 | McDonough et al. | 364/200 |
| 4,545,038 | 10/1985 | Bellay | 365/230 |
| 4,665,480 | 5/1987 | Robert et al. | 364/200 |
| 4,718,037 | 1/1988 | Thaden | 364/900 |

OTHER PUBLICATIONS

Official Action from German Patent Office; English Translation of German Office Action.

Primary Examiner—Gareth D. Shaw
Assistant Examiner—Rebecca L. Adams
Attorney, Agent, or Firm—Sughrue, Mion, Zinn, Macpeak & Seas

[57] ABSTRACT

A microcomputer system including an EPROM (electrically programmable read-only memory) which can be programmed either externally or by the control processing unit of the system. The control means, normally responsive to externally applied control signals, is disabled by a register of the system which can be set by the control processing unit and by an address decoder connected to the address bus.

4 Claims, 4 Drawing Sheets

MICROCOMPUTER WITH INTERNALLY AND EXTERNALLY PROGRAMMED EPROM

BACKGROUND OF THE INVENTION

1. Field of the Invention

The present invention relates to a single-chip microcomputer including an erasable and electrically-programmable read-only memory.

2. Background Art

FIG. 1 shows a block diagram of the circuitry for reading from and writing into an electrically-programmable read-only memory included in a conventional single-chip 8-bit microcomputer. The dotted line, chain line and full line in FIG. 1 respectively show the flow of electric power, control signals and data signals. FIG. 1 also shows external power supplies $V_{cc}$ and $V_{pp}$, control signals PGM (relating to program memory), CE (relating to chip enabling) and OE (relating to output enabling), which are externally applied. This figure also shows 13-bit address signals $AD_0$–$AD_{12}$ and 8-bit data signals $D_0$–$D_7$. A writing control circuit 2 receives the control signals PGM, CE and OE from the outside, and sends a control signal PRG* to a writing circuit 3 and to a power supply switchover circuit 4. A reading control circuit 5 also receives the control signals PGM, CE and OE from the outside and sends reading signals $\phi_R$ and $\overline{RP}$ to a reading circuit 6. A Y-directional decoder (column decoder) 7 decodes the address signals $AD_1$–$AD_4$, and sends decoded signals $y_i$ to a Y-directional selector 8. An X-directional decoder (row decoder) 9 decodes the address signals $AD_5$–$AD_{12}$, and sends decoded signals $x_i$ to the memory cells 10 of the EPROM. The address signals and the data signals are inputted and outputted through I/O (input/output) ports 11a, 11b and 11c. The address signals $AD_0$–$AD_{12}$, which are inputted through the I/O ports 11a and 11b and are 13 bits wide, are transmitted through an address bus so that the address signal $AD_0$ is entered into the writing circuit 3, the address signals $AD_1$–$AD_4$ are entered into the Y-directional decoder 7, and the address signals $AD_5$–$AD_{12}$ are entered into the X-directional decoder 9. The data signals, which are inputted and outputted through the I/O port 11c, are transmitted through a data bus so that the data signals $D_0$–$D_7$ are entered into the writing circuit 3 or sent out from the reading circuit 6.

FIG. 2 shows a circuit diagram illustrating the structure and connections of the writing control circuit 2 shown in FIG. 1. The same reference symbols denote the same portions in FIGS. 1 and 2. The writing control circuit 2 in FIG. 2 includes an inverter 21, a NAND gate 22 and a NOR gate 23.

Since reading from the EPROM shown in FIG. 1 is performed in the same manner as that of a conventional ROM or RAM, the description of the reading from the EPROM is omitted herein and only writing into the EPROM is described. To write into the EPROM, the single-chip microcomputer is reset and the power $V_{pp}$, which is a voltage of 21 V, is applied. At that time, the other power $V_{cc}$ is a voltage of 5 V, the control signal PGM is set to a low level L, CE is set to a high level 'H' and OE is set at a low level 'L'. The address signals $AD_0$–$AD_{12}$ are inputted through the I/O ports 11a and 11b and the data signals $D_0$–$D_7$ are inputted through the I/O port 11c. The output from the NAND gate 22 and the signal PRG* are at a high level 'H' and a low level 'L', respectively. When the signal PGM is thereafter set at a high level 'H', the signal PRG* of a high level 'H' is applied to the writing circuit 3 so that a data signal whose logic state is '0' or '1' is written into a memory cell 10 selected by the decoded address.

The control signal OE being at a high level 'H' means that the data signals are entered from the I/O port 11c into a writing circuit 3 through the data bus. The address signals are always inputted from the I/O ports 11a and 11b. Namely, the address signals $AD_1$–$AD_4$ are entered into the Y-directional decoder 7, and the address signals $AD_5$–$AD_{12}$ are entered into the X-directional decoder 9.

When the control signal PRG* is set at a high level 'H', the output $V_{cc}/V_{pp}$ from the power supply switchover circuit 4 becomes the higher power voltage $V_{pp}$ so that a voltage of 21 V is applied to the Y-directional decoder 7 and the X-directional decoder 9. Therein, the voltage of the decoded signals $y_i$ and $x_i$ take the same level as the high-level power $V_{pp}$.

If the logic level of a data bit is '0' in the writing circuit 3 when the signal PRG* is at a high level 'H', the voltage $V_{pp}$ is applied to the Y-directional selector 8 through a signal line 13. If the logic level of the data bit is '1' in the writing circuit 3, the signal line 13 is disconnected. For that reason, when the logic level of a written data signal is '0', a voltage of the same level as the power voltage $V_{pp}$ is applied from the writing circuit 3 through the Y-directional selector 8 to the drain of the transistor of a memory cell selected by an address signal $AD_1$–$AD_{12}$. Also, a voltage of the same level as the power voltage $V_{pp}$ is applied from the X-directional decoder 9 to the gate of the transistor of the memory cell 10, and electrons enter into the floating gate of the transistor of the memory cell. When the logic level of written data signal is '1', the entry of the electrons into the floating gate does not take place because no high voltage is applied to the drain of the transistor. The electrons entered into the floating gate are not spontaneously discharged, but are retained. The logic of a signal stored in the transistor of the memory can be read in terms of whether or not the threshold potential has been changed due to the entry of the electrons into the floating gate.

In a conventional single-chip microcomputer including the EPROM, writing into the EPROM cannot be performed without entering the address signal and the data signal by an external device such as an EPROM writer when the microcomputer is out of operation. Therefore, the conventional microcomputer has a problem that a simple operation process which causes the microcomputer to execute its own writing instruction so as to write into the EPROM so as to write into a RAM cannot be performed.

SUMMARY OF THE INVENTION

The present invention was made in order to solve the above-mentioned problem. Accordingly, it is an object of the present invention to provide a new function of performing writing into an EPROM by executing a writing instruction within a microcomputer itself in addition to providing a conventional function of performing writing into the EPROM, so as not only to enable the use of the EPROM as a program memory but also to enable the use of the EPROM as a nonvolatile memory during the execution of a program, thus increasing the efficiency of utilization of the EPROM.

The microcomputer provided according to the present invention includes a 1-bit writing mode register, which retains a switchover signal for selecting either writing into the EPROM by an external writing device or writing into the EPROM by the execution of an instruction by the microcomputer itself, and a switchover means for changing a writing method depending on the contents of the writing mode register.

According to the present invention, writing into the EPROM can be performed by the execution of the instruction by the microcomputer. For that reason, it is easy to use the EPROM for a purpose other than as a program memory.

DETAILED DESCRIPTION OF THE PREFERRED EMBODIMENTS

An embodiment of the present invention is hereafter described with reference to the drawings.

Figure 1:
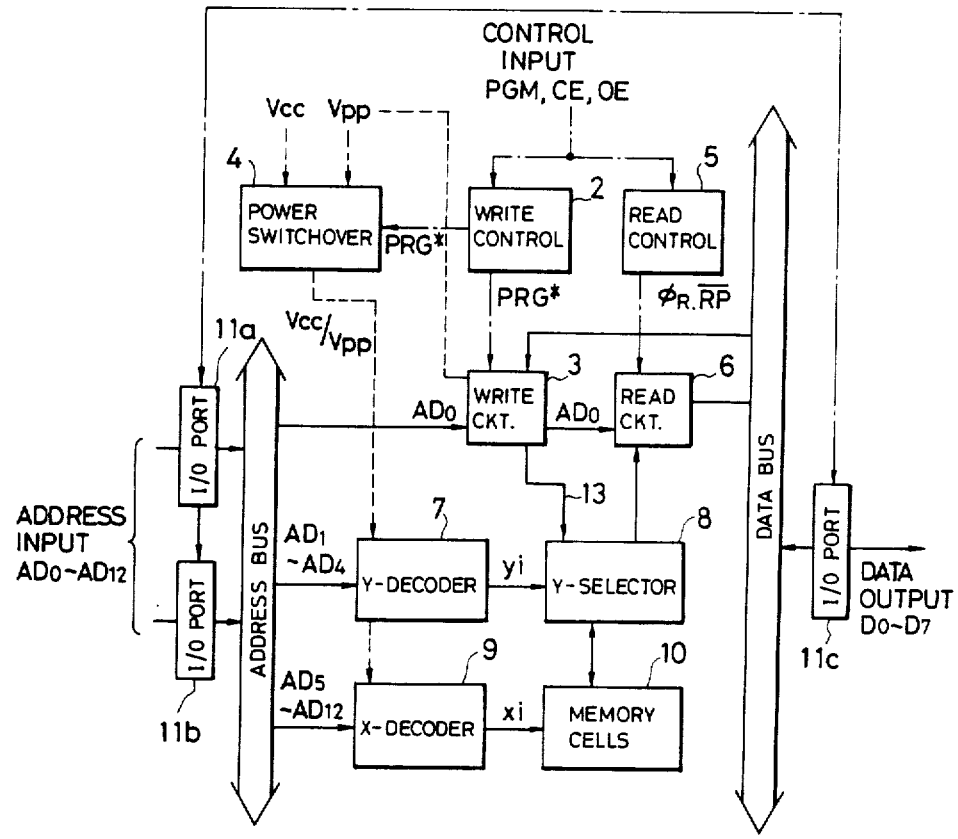
FIG. 1 shows a block diagram of a conventional microcomputer.
Figure 3:
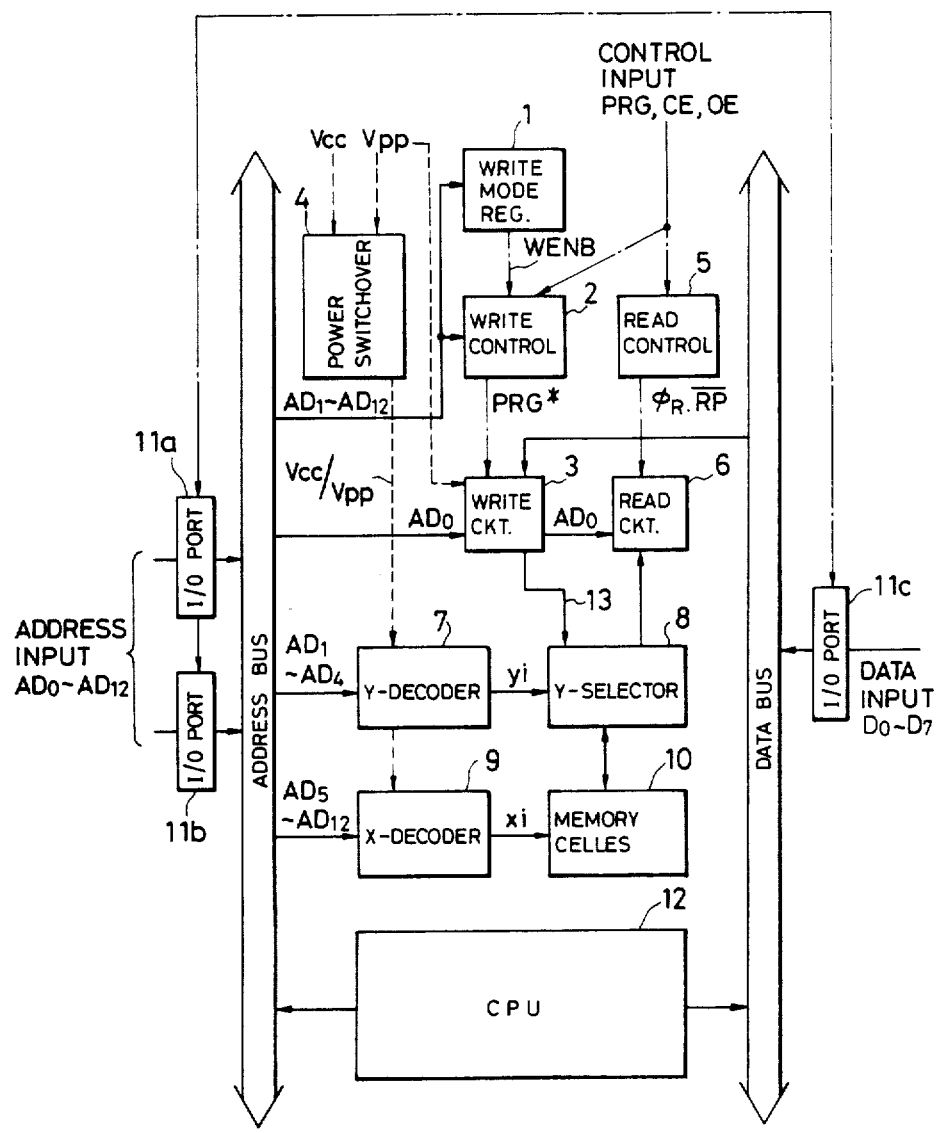
FIG. 3 shows a block diagram of an embodiment of the present invention.

FIG. 3 shows a block diagram of an embodiment of the invention. The same reference symbols denote the same or equivalent portions in FIGS. 1 and 3. FIG. 3 shows the flow of electric power, control signals and data signals in the same manner as FIG. 1. Additionally included in the embodiment of FIG. 1 are a writing mode register 1 and a central processing unit 12 (hereinafter often referred to as CPU).

Figure 2:
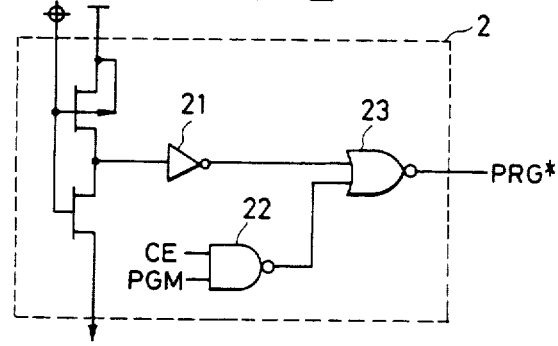
FIG. 2 shows a circuit diagram of a writing control circuit shown in FIG. 1.
Figure 4:
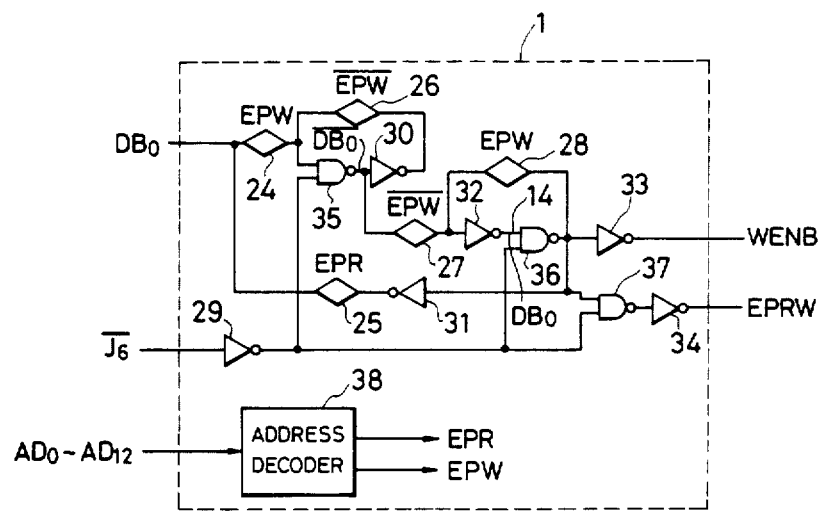
FIG. 4 shows a circuit diagram of a writing mode register shown in FIG. 3.

FIG. 4 shows a circuit diagram indicating the structure and connections of the writing mode register 1, which includes transfer gates 24, 25, 26, 27 and 28, inverters 29, 30, 31, 32, 33 and 34, NAND gates 35, 36 and 37, and an address decoder 38. The true and complemented versions of the outputs EPR and EPW of the address decoder 38 are applied to the transfer gates 24, 25, 26, 27 and 28, as indicated by FIG. 2, to pass signals therethrough. An output 14 from the inverter 32 indicates the contents of the writing mode register 1.

Figure 5:
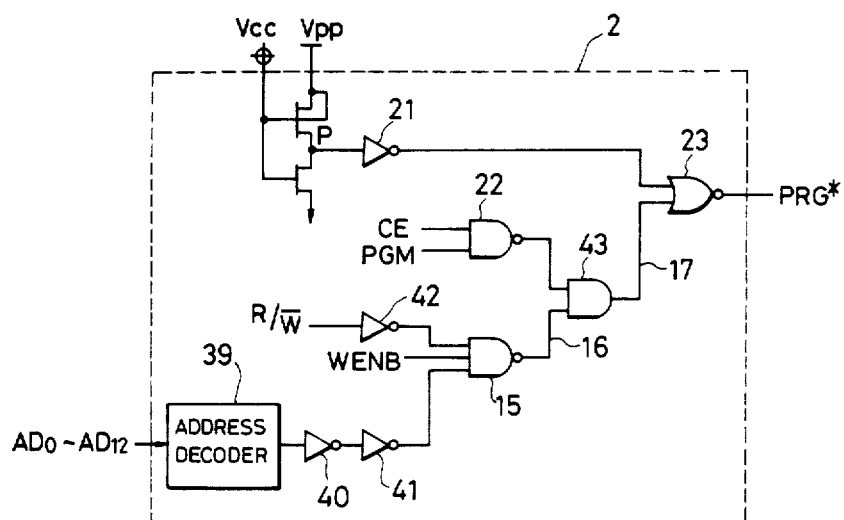
FIG. 5 shows a circuit diagram of a writing control circuit shown in FIG. 3.

FIG. 5 shows a circuit diagram indicating the structure and connections of the writing control circuit 2 shown in FIG. 3. The same reference symbols denote the same or equivalent portions in FIGS. 2 and 5. FIG. 5 shows a NAND gate 15, a writing state output 16 from the NAND gate 15, an address decoder 39, inverters 40, 41 and 42, an AND gate 43, and an output 17 from the AND gate 43.

The writing state output 14 from the inverter 32 shown in FIG. 4 is a signal indicating the contents of the writing mode register 1. When the logic state of the output 14 is '0', a signal WENB which is the output from the inverter 33 takes a low level 'L' and the output from the NAND gate 15 shown in FIG. 5 takes a high level 'H', so that the circuit shown in FIG. 5 becomes equivalent to that shown in FIG. 2 since it produces the same signal PRG* when the writing state output 14 is '0'. As a result, address signals $AD_0$–$AD_{12}$ and data signals $D_0$–$D_7$ can be inputted from outside in a conventional method so as to perform writing into the EPROM of a microcomputer.

A method of performing writing into the EPROM by an instruction of the microcomputer 12 itself is hereafter described. FIG. 4 shows a signal EPR for reading out to a mode register, and a signal EPW for writing into the mode register. These signals are stored in prescribed addresses in the program of the microcomputer, and sent out from the address decoder 38. FIG. 4 also shows a 0-th bit signal $\overline{DB_0}$ on the data bus, and a resetting signal $\overline{J6}$. FIGS. 4 and 5 both show control signals WENB and EPRW for changing a method of writing into the EPROM, and a read/write signal R,$\overline{W}$ for the EPROM. As shown in FIG. 4, transfer gates are controlled by the signal EPR and the signal EPW (or a signal EPW whose logic state is complemented from that of the signal EPW). A flip-flop is constituted by feedback from the inverters 30 and 31 to the NAND gate 35. When a signal whose logic level is '1' is written into the flip-flop (at that time, the logic of the output 14 is made into '1'), the signal WENB takes a high level 'H' and the signal EPRW takes a low level 'L'. Referring to FIG. 5, if WENB is at a high level 'H' when R/$\overline{W}$ is low and the chosen address is on the address bus, the outputs of both the NAND gate 15 and of the AND gate 23 are at high levels 'H'. Thus the signal PRG* is turned to a high level 'H'. After that, a voltage of 21 V is applied from the writing circuit 3 t the Y-direction selector 8 as the power $V_{pp}$. At that time, since the microcomputer remains not reset and the level of the signal EPRW is 'L', the address bus and the data bus are not connected to the outside through I/O ports 11a, 11b and 11c but are connected to the output portions of the CPU 12 so that the microcomputer 12 is in a mode to execute a program of the microcomputer 12 itself.

Figure 6:
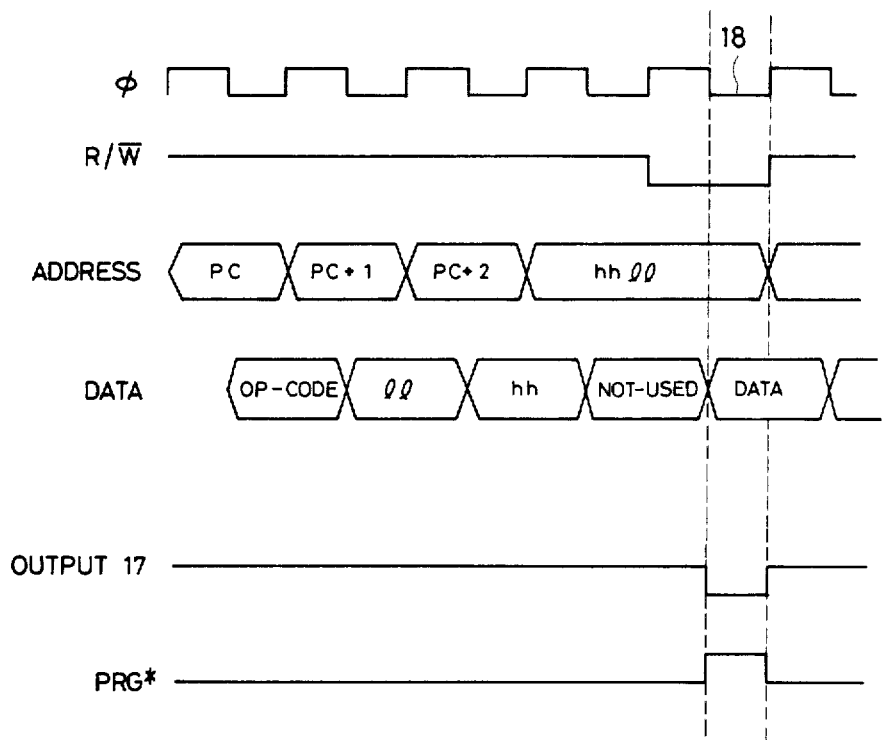
FIG. 6 shows a timing chart of a case where writing into the EPROM of a microcomputer is performed by the control action of the microcomputer.

FIG. 6 shows a time chart for a case in which a data signal is written into a prescribed address (arbitrarily denoted by hh11) of the EPROM by an instruction such as an STA instruction for writing into an optional address in the EPROM, when the microcomputer is in the above-mentioned mode. FIG. 6 shows a basic clock signal $\phi$ for the microcomputer, and the contents PC of the program counter. The signal R/$\overline{W}$, the address signal, the data signal, the state output 14 and the signal PRG* shown in FIG. 6 are the same as those shown by the same reference symbols in FIGS. 3, 4 and 5. As shown in FIG. 6, when the level of the clock signal $\phi$ is 'L', that of the signal PRG* is 'H'. Each of the address signals, which are supplied from the CPU 12 to a Y-directional and an X-directional decoders 7 and 9 through the address bus, changes as denoted by PC, PC+1 and PC+2. When the address signal is PC+2, a data signal denoted by hh is outputted. The symbol hh11 denotes an address to which writing is to be performed. After the signal PC+2, an address signal hh11 is outputted to the address bus. The data signal to be written into the address hh11 is inputted from the CPU 12 through the data bus and the writing circuit 3 so that the writing into the EPROM is performed in the same manner as that performed from outside. Since the time throughout which the level of the clock signal $\phi$ is the 'L' is very short (for example, as 250 nanoseconds), an identical instruction needs to be repeatedly executed a number of times in order to ensure the writing into the EPROM.

The embodiment is described above as to a case that writing is performed by the STA instruction in the single-chip 8-bit microcomputer including the EPROM. Writing into the EPROM can be performed by the execution of an instruction inside the microcomputer as far as an address in the EPROM is determined inside the microcomputer and the instruction is for writing a data signal from the writing circuit 3 into the appointed address.

According to the present invention, writing into the EPROM of a microcomputer can be performed by a writing instruction possessed by the microcomputer itself. For that reason, the region of the EPROM which is not written of a program, but which can conventionally be used only as a program memory, can be used also as a nonvolatile memory during the execution of a program.

What is claimed is:

1. A microcomputer system, comprising:
   a central processing unit;
   electrically-programmable read-only memory means;
   a data bus connected to said central processing unit, and to an externally connected data port for externally applied data information;
   an address bus connected to said central processing unit, to said memory means and to an externally connected address port for externally applied address information;
   means for selectively applying a programming voltage higher than a reading voltage to a location in said memory means addressed by said address bus for programming data from said data bus;
   a writing mode register for containing control information as to whether voltage programming of said memory means is to be performed by said central processing unit or by signals externally applied to said data and address ports;
   first control means responsive to externally applied control signals for applying control signals to said address and data ports and to said applying means to enable said data and address ports and said applying means for externally applied address and data information;
   second control means responsive to control signals from said central processing unit for applying control signals to said applying means and for disabling said data and address ports to externally applied address and data information,
   wherein said writing mode register selectively enables one or the other of said first and second control means,
   wherein said central processing unit outputs on said address bus one of a read out signal and a write signal to said writing mode register for reading out of and writing into the EPROM, respectively, and
   wherein said second control means receives an output of said write mode register, address information from said data bus and a read/write signal, said second control means disabling said data and address ports to externally applied data and address information when enabled by said writing mode register output signal.

2. A microcomputer system as recited in claim 1, further comprising means for writing into said writing mode register information contained on said data bus.

3. A microcomputer system as recited in claim 2, wherein said writing means comprise an address decoder connected to said address bus for selectively enabling said writing into said writing mode register.

4. A microcomputer system as recited in claim 1, wherein said second control means comprises a second address decoder connected to said address bus and a logic circuit receiving an output of said writing mode register register and said second address decoder, said logic circuit selectively disabling said first control means.

* * * * *